United States Patent
Mastovich

(10) Patent No.: US 8,143,961 B2
(45) Date of Patent: Mar. 27, 2012

(54) TECHNIQUE FOR DETECTING CRYSTALS

(75) Inventor: Stefan Mastovich, Pflugerville, TX (US)

(73) Assignee: Silicon Laboratories Inc., Austin, TX (US)

(*) Notice: Subject to any disclaimer, the term of this patent is extended or adjusted under 35 U.S.C. 154(b) by 1 day.

(21) Appl. No.: 12/749,995

(22) Filed: Mar. 30, 2010

(65) Prior Publication Data

US 2011/0241787 A1  Oct. 6, 2011

(51) Int. Cl.
*H03B 5/32* (2006.01)
*G01R 23/00* (2006.01)

(52) U.S. Cl. ......... 331/158; 331/44; 331/74; 331/108 C; 331/143

(58) Field of Classification Search ............. 331/44, 331/74, 108 C, 143, 158
See application file for complete search history.

(56) References Cited

U.S. PATENT DOCUMENTS

| | | | | |
|---|---|---|---|---|
| 4,633,316 A | * | 12/1986 | Burke et al. | 348/737 |
| 6,016,081 A | * | 1/2000 | O'Shaughnessy | 331/48 |
| 6,052,035 A | * | 4/2000 | Nolan et al. | 331/74 |
| 6,107,894 A | * | 8/2000 | Van Tuijl et al. | 331/143 |
| 7,307,481 B1 | * | 12/2007 | Bell et al. | 331/49 |
| 7,724,100 B2 | * | 5/2010 | Gong et al. | 331/111 |

* cited by examiner

*Primary Examiner* — Levi Gannon

(74) *Attorney, Agent, or Firm* — Zagorin O'Brien Graham LLP

(57) ABSTRACT

In at least one embodiment of the invention, an apparatus includes an integrated circuit, which includes a first oscillator terminal and an oscillator discrimination circuit. The oscillator discrimination circuit is operative to generate an indicator of a capacitance value of a load capacitance external to the integrated circuit and coupled to one of the first and second oscillator terminals. The indicator is generated according to a charge time of a reference node coupled to a reference capacitor and a charge time of a node coupled to the first oscillator terminal. The node and the reference node are charged using substantially matched currents.

24 Claims, 4 Drawing Sheets

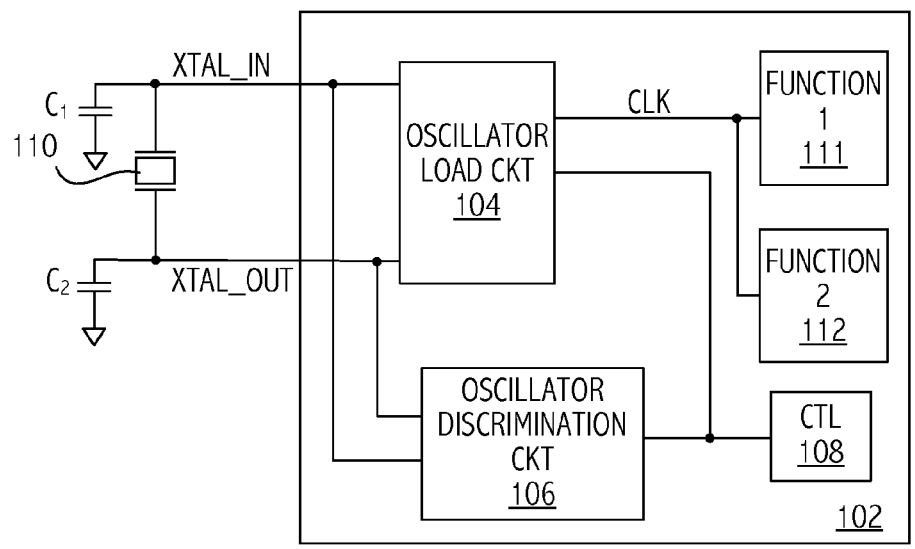
FIG. 1
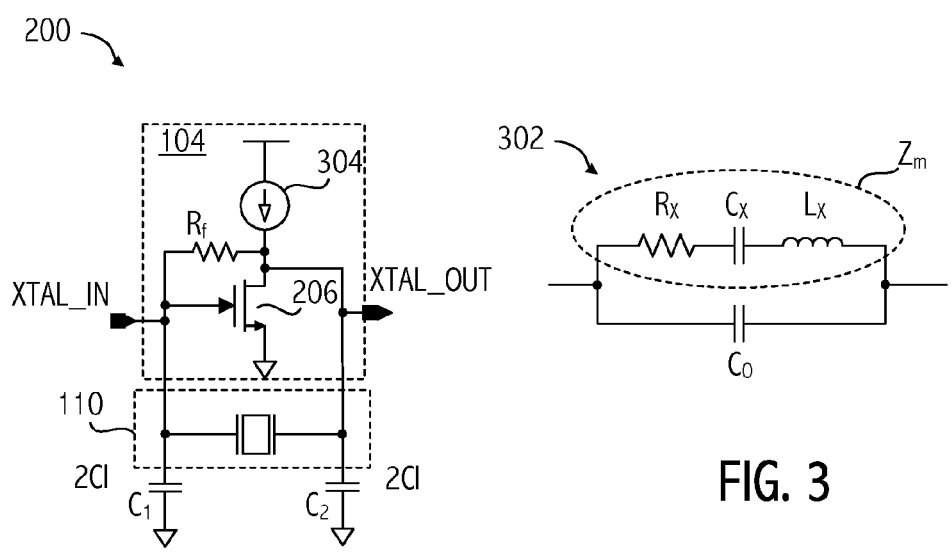
FIG. 2
FIG. 3

TECHNIQUE FOR DETECTING CRYSTALS

BACKGROUND

1. Field of the Invention

This application is related to integrated circuits and more particularly, to integrated circuits that use oscillator circuits.

2. Description of the Related Art

In general, an integrated circuit uses an oscillator circuit to generate a clock signal that is provided to functional circuits. A typical oscillator circuit includes an oscillator that has a precise resonant frequency and load capacitors, which are external to the integrated circuit (e.g., an external crystal oscillator), and an oscillator load circuit on the integrated circuit. The integrated circuit may include functional circuits that are able to operate with oscillators of substantially different resonant frequencies. However, the integrated circuit may not have non-volatile memory available for communicating oscillator frequency information to the integrated circuit. In addition, the integrated circuit may not have an available pin for programming the oscillator frequency. Moreover, a supplier of the integrated circuit may not want to require a user to include a sequence for programming the oscillator frequency in a configuration sequence.

SUMMARY

In at least one embodiment of the invention, an apparatus includes an integrated circuit, which includes a first oscillator terminal and an oscillator discrimination circuit. The oscillator discrimination circuit is operative to generate an indicator of a capacitance value of a load capacitance external to the integrated circuit and coupled to one of the first and second oscillator terminals. The indicator is generated according to a charge time of a reference node coupled to a reference capacitor and a charge time of a node coupled to the first oscillator terminal. The node and the reference node are charged using substantially matched currents.

In at least one embodiment of the invention, a method includes, in a first mode of operating an integrated circuit, charging an external capacitive load associated with an external oscillator using a first current and charging a reference capacitor using a second current. The first and second currents are substantially matched currents. The method includes comparing a first charge time of the external capacitive load to a second charge time of the reference capacitor and supplying an indicator based thereon.

In at least one embodiment of the invention, an apparatus includes an integrated circuit, including an oscillator input terminal and an oscillator output terminal. The integrated circuit is responsive in a first mode to self-select a mode of operating the integrated circuit in response to a charge time of a capacitive load external to the integrated circuit and coupled to one of the oscillator input and output terminals. In a second mode of operation, the integrated circuit is responsive to generate a system clock signal according to the charge time.

BRIEF DESCRIPTION OF THE DRAWINGS

The present invention may be better understood, and its numerous objects, features, and advantages made apparent to those skilled in the art by referencing the accompanying drawings.

FIG. 1 illustrates a functional block diagram of an integrated circuit configured to generate a clock signal using an external crystal oscillator consistent with at least one embodiment of the invention.

FIG. 2 illustrates a circuit diagram of a crystal oscillator circuit consistent with at least one embodiment of the invention.

FIG. 3 illustrates a circuit diagram of an equivalent circuit of the crystal oscillator of FIGS. 1 and 2 consistent with at least one embodiment of the invention.

The use of the same reference symbols in different drawings indicates similar or identical items.

DESCRIPTION OF THE PREFERRED EMBODIMENT(S)

Figure 4:
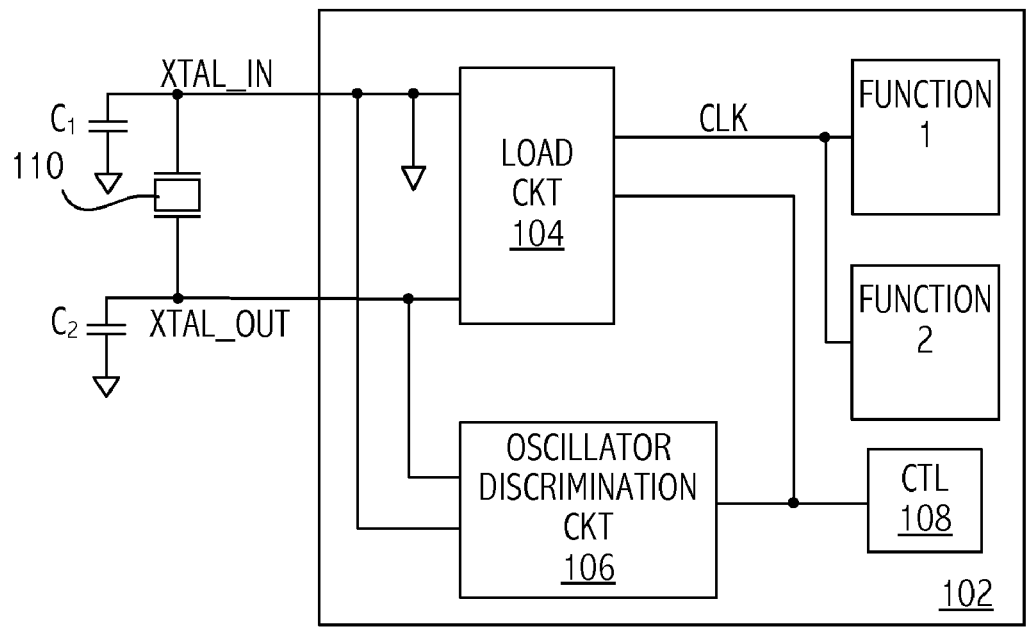
FIG. 4 illustrates a functional block diagram of an integrated circuit configured to determine an oscillator frequency consistent with at least one embodiment of the invention.

Referring to FIG. 1, an integrated circuit (e.g., integrated circuit 102) configured for typical operation provides a clock signal to functional circuits based on a crystal oscillator circuit including an external oscillator (e.g., crystal oscillator 110), at least one load capacitor (e.g., load capacitors $C_1$ and $C_2$), and an oscillator load circuit (e.g., oscillator load circuit 104). The external oscillator is coupled to integrated circuit 102 via an oscillator input pin (e.g., XTAL_IN) and an oscillator output pin (XTAL_OUT). In at least one embodiment, the integrated circuit includes circuitry that performs a first function (e.g., modem transceiver operations) and circuitry that performs a second function (e.g., battery-backed up real time clock (RTC)). The circuitry that performs the first function operates with a clock signal having a first frequency (e.g., a modem operating with a 4.9152 MHz clock signal). The circuitry that performs the second function may operate at a lower frequency. For example, although a battery charging function may operate at the same frequency as the modem application, the battery charging function may also operate using a clock signal having a second frequency that is substantially lower than the first frequency (e.g., a 32.768 kHz clock signal).

Accordingly, an integrated circuit including both functions generates a clock signal having the first frequency and can operate both functions at the higher frequency. In at least one embodiment, the integrated circuit generates a clock signal having the second frequency and operates the second function at the second frequency and multiplies the clock signal by a multiple to provide a clock signal having the first frequency to the first function. Since a lower frequency oscillator may be less expensive, the latter system may have a lower bill of materials. Rather than requiring that the integrated circuit include non-volatile memory to store an indicator of the frequency, requiring an extra pin to provide the indicator of the frequency, and/or requiring a special startup sequence, as discussed above, oscillator discrimination circuit 106 generates an indicator of a frequency of the oscillator coupled to integrated circuit 102, and integrated circuit 102 self-selects a mode of operating the integrated circuit based on that indicator. Thus, integrated circuit 102 remains compatible with systems designed for a single crystal frequency.

Referring to FIGS. 2 and 3, a clock signal is generated by an exemplary crystal oscillator circuit (e.g., crystal oscillator circuit 200, which includes crystal oscillator 110, external load capacitors $C_1$ and $C_2$, and oscillator load circuit 104). In at least one embodiment, load circuit 104 is a Pierce oscillator circuit, which includes an inverter (e.g., device 206) and a feedback resistor $R_F$ (e.g., approximately 30 pf). An equivalent circuit for a crystal oscillator is illustrated in FIG. 3, where $C_O$ is the shunt capacitance of the crystal oscillator. Referring back to FIG. 2, feedback resistor $R_F$ is sufficiently large to bias device 206 in its linear region of operation, thereby causing device 206 to function as a high-gain inverting amplifier. When crystal oscillator 110 is coupled to oscillator load circuit 104, the circuit functions as a pi network band-pass filter, which provides a 180 degree phase shift and a voltage gain from XTAL_OUT to XTAL_IN at approximately the resonant frequency of the crystal oscillator. The 180 degree phase shift in combination with the negative gain of device 206 provides positive feedback resulting in oscillation. The load capacitance ($C_L$) is the total capacitance seen by the crystal oscillator looking into the rest of the circuit. In general, the load capacitance is designed to have a value (e.g., approximately 18 or 20 pF) that matches a value specified in the crystal data sheet, which is the effective load that the crystal must see to oscillate at the frequency specified in the data sheet. Note that load oscillator circuit 104 is exemplary only and other oscillator circuit configurations may be used.

Figure 5:
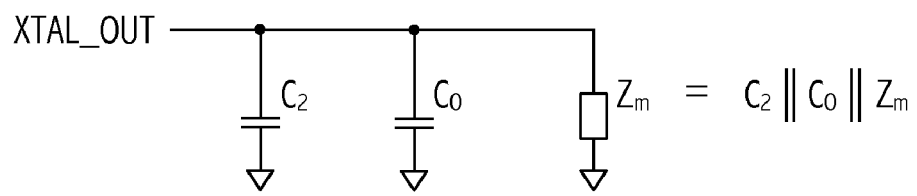
FIG. 5 illustrates an equivalent circuit diagram for the crystal oscillator circuit of FIG. 2, consistent with at least one embodiment of the invention.

Referring to FIG. 4, in at least one embodiment, integrated circuit 102 configures itself for operation with an oscillator of one of a plurality of frequencies without using non-volatile memory or a pin to receive oscillator configuration information. Integrated circuit 102 couples the oscillator input terminal (e.g., XTAL_IN) to an internal ground node after a power-on sequence and during a first mode of integrated circuit 102, e.g., an initialization (i.e., setup or configuration) mode. This allows current to be redirected to the output capacitance formed by the parallel combination of a load capacitance and the crystal. The load impedance of the remaining circuit is illustrated in FIG. 5 and has an equivalent value of $C_2 \| C_O \| Z_m$, where $$Z_m = R_x + j\omega L_x + \frac{1}{j\omega L_x} = R_x + \frac{j(\omega^2 L_x C_x - 1)}{\omega C_x} = R_x + j\left[\frac{\left(\frac{\omega}{\omega_m}\right)^2 - 1}{\omega C_x}\right],$$

where $\omega_m$ is the resonant frequency of $Z_m$ and $\omega_m$ is equal to $(L_x C_x)^{-1/2}$.
When $\omega \ll \omega_m$, $$Z_m = R_x - \frac{j}{\omega C_x}.$$

When the XTAL_IN node is coupled to ground, device 206 is effectively turned off and capacitor $C_1$ is effectively removed from the circuit. Feedback resistor $R_F$ is sufficiently large that it may be considered an open circuit. Since $Z_m \ll C_2$, $C_O$, in that configuration, for a constant charging current, the load on XTAL_OUT then looks like a capacitance of value $C=C_2+C_O$, where $C_2$ is an external capacitor on the oscillator output terminal, XTAL_OUT, and $C_O$ is the shunt capacitance of the crystal. Thus, oscillator 110 and external capacitor $C_2$, which are coupled to the oscillator output terminal, XTAL_OUT, are configured as a substantially capacitive external load when sufficiently far away from the resonant frequency. In at least one embodiment, oscillator 110 has a $C_x$ of approximately 2-10 fF. Other exemplary capacitance values are illustrated in Table 1.

TABLE 1

Equivalent External Capacitance

| Crystal Frequency | $C_2$ | $C_O$ | Equivalent External Capacitance |
|---|---|---|---|
| 32.768 kHz | 22 pF | 2 pF | 24 pF |
| 4.9152 MHz | 33 pF | 7 pF | 40 pF |

Figure 6:
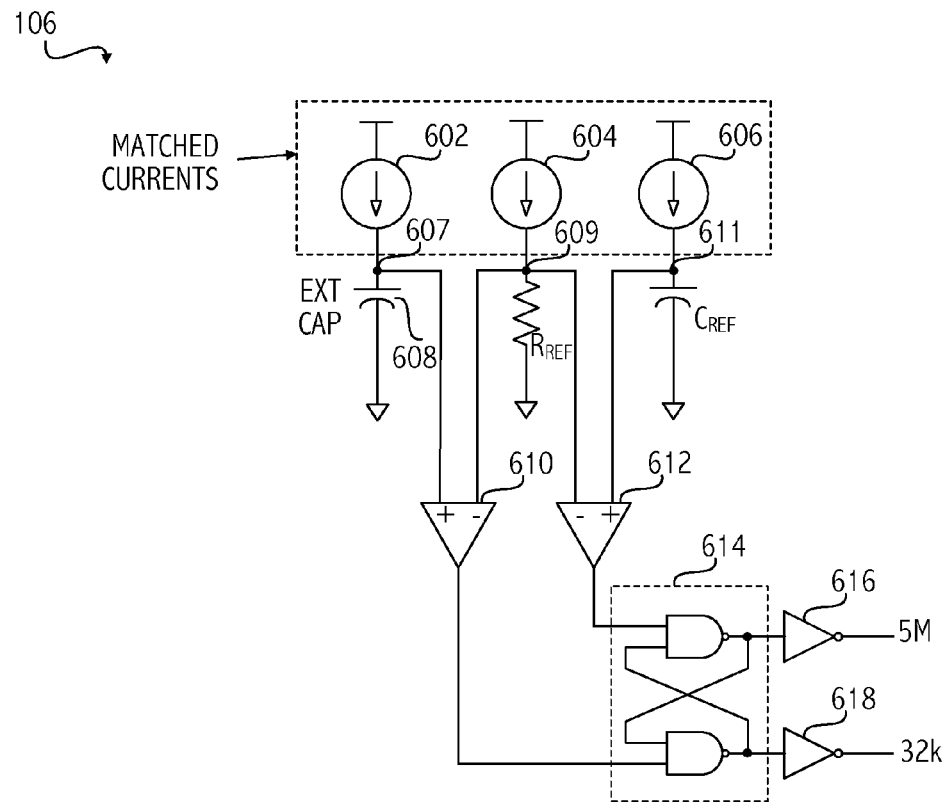
FIG. 6 illustrates a circuit diagram of an oscillator discrimination circuit, consistent with at least one embodiment of the invention.

Referring to FIG. 6, an oscillator discrimination circuit (e.g., oscillator discrimination circuit 106) uses the external load capacitance (e.g., crystal oscillator 110 and $C_2$) to generate an indicator of the frequency of the crystal oscillator coupled to integrated circuit 102. Since the equivalent external capacitances of crystals expected to be coupled to integrated circuit 102 are sufficiently different, discrimination between the two equivalent external capacitance values is achieved by comparing a charge time of the external capacitive load to the charge time of a reference node coupled to a reference capacitor, in response to the capacitive load and the reference capacitor receiving substantially matched currents.

In at least one embodiment, oscillator discrimination circuit 106 includes an internal reference capacitor (e.g., $C_{REF}$) that is used to generate an indicator of a frequency of the crystal coupled to node 607 (i.e., XTAL_OUT). When XTAL_IN is grounded, current source 602 provides charge to external capacitance 608. In at least one embodiment, current source 602 of oscillator discrimination circuit 106 is the same current source of oscillator load circuit 104 (i.e., current source 304). However, in other embodiments, current source 304 and current source 602 are different current sources and current source 602 is selectively coupled to node 607. The charge time of the node 607 will depend on the size of external capacitance 608 (e.g., $C_2+C_O$). Comparator 610 subtracts a reference voltage level (e.g., voltage level on node 609) from the voltage on node 607. Once capacitor 608 charges up such that node 607 has a voltage level greater than the voltage on node 609, the output of comparator 610 transitions (e.g., from low to high). The time for node 607 to achieve the voltage level of node 609, which is based on the value of the external load capacitance, varies according to the frequency of the crystal oscillator. The node having a smaller load capacitance charges to the reference voltage first.

Meanwhile, while XTAL_IN is grounded, current source 606 provides charge to reference capacitor $C_{REF}$. Comparator 612 subtracts a reference voltage level (e.g., voltage level on node 609) from the voltage on node 611. Once capacitor $C_{REF}$ charges up such that node 611 has a voltage level greater than the voltage on node 609, the output of comparator 612 transitions (e.g., from low to high). The time for node 611 to achieve the voltage level of node 609 is based on the value of the capacitance of $C_{REF}$. Oscillator discrimination circuit 106 is designed to include a $C_{REF}$ value that is greater than the equivalent external capacitance (i.e., the external capacitive load) for a 32.768 KHz crystal, but less than the equivalent external capacitance for a 4.9152 MHz crystal. If node 611 reaches the reference voltage level of node 609 before node 607, then the external capacitance is greater than $C_{REF}$. If node 607 reaches the reference voltage level of node 609 before node 611, then the external capacitance is less than $C_{REF}$. Circuit 614 latches an indicator of the node that reaches the reference voltage level first. In at least one embodiment of oscillator discrimination circuit 106, additional logic is included to change the polarity of the output indicator (e.g., inverters 616 and 618 are included to generate active high, one-shot signals indicating that the crystal is either 4.9152 MHz or 32.768 kHz). In at least one embodiment of oscillator discrimination circuit 106, reset logic is included to reset nodes 607 and 611 of oscillator discrimination circuit 106 when the chip restarts operations and prior to oscillator discrimination. In at least one embodiment, after oscillator discrimination, node 607 is released for use in oscillator load circuit 104 and node 611 is discharged.

Note that in at least one embodiment of oscillator discrimination circuit 106, the absolute value of current is not critical, but the current sources are substantially matched using standard matching techniques. In addition, since both comparators use the same reference, the reference need not be precise. In at least one embodiment of oscillator discrimination circuit 106, current and capacitor scaling is used to save area. For example, an external current through the oscillator output terminal is ten times greater than an internal on-chip current (i.e, $I_{EXT}=10\ I_{INT}$), and reference capacitor $C_{REF}$ is scaled by 1/10. If a target equivalent external capacitance threshold is 30 pF, and a current mirror sets the ratio of $I_{EXT}$ to $I_{INT}$ to 10:1, then the internal reference capacitance ($R_F$) should be 3 pf. If $I_{EXT}$ is 1 μA, then $I_{INT}$ is 100 nA, and the time to charge the reference capacitance to 1V is 30 μs. Note that accurate reference voltage magnitude and accurate current magnitudes are not required. However, accuracy of matching current sources 602 and 606 and accuracy of the absolute value of CREF affect the circuit error.

Note that although oscillator discrimination circuit 106 generates an indicator distinguishing a frequency of a crystal oscillator from two different frequencies, techniques described herein may be applied to other embodiments of oscillator discrimination circuit 106 that generate an indicator of a crystal oscillator frequency coupled to an oscillator output terminal that may have three or more different frequencies. For example, additional comparators, additional reference capacitors, and logic circuitry may be used to distinguish between the oscillator coupled to XTAL_OUT and different internal reference capacitor values.

Referring back to FIG. 2, in at least one embodiment of integrated circuit 102, the output of oscillator discrimination circuit 106 is used (e.g., directly or via control circuit 108) to selectively enable as current reference 304 a current source circuit corresponding to the frequency of the oscillator from a plurality of current source circuits for the oscillator load circuit 104. In at least one embodiment, current reference 304 is a variable current source and the output of oscillator discrimination circuit 106 is used (e.g., directly or via control circuit 108) to configure variable current source 304 according to the frequency of the crystal oscillator. Referring to FIG. 1, in at least one embodiment of integrated circuit 102, in a first mode of operation, when a first crystal frequency is indicated (e.g., 32.768 kHz), integrated circuit 102 configures circuit 111 to multiply the frequency of the clock signal (e.g., 32.768 kHz) to generate a clock signal having a higher frequency (e.g., 4.9152 MHz) to implement the first function (e.g., modem transceiver functions) in a second mode of operating integrated circuit 102. During a second mode of operating integrated circuit 102, circuit 112, which implements a second function (e.g., battery charging operations), operates using the clock signal without frequency multiplication. When a second crystal frequency is indicated (e.g., 4.9152 MHz) by the first mode of operating integrated circuit 102, in the second mode of operating integrated circuit 102, circuit 111 does not multiply the frequency of the clock signal and implements the first function using the clock generated by oscillator load circuit 104 without frequency multiplication. Circuit 112 also operates using the clock signal generated by oscillator load circuit 104 without frequency multiplication.

Figure 7:
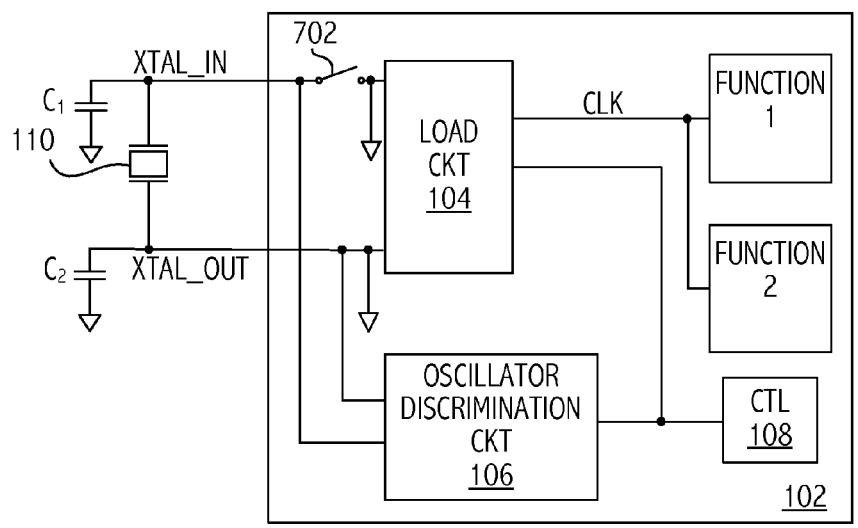
FIG. 7 illustrates a functional block diagram of an integrated circuit configured to determine an oscillator frequency consistent with at least one embodiment of the invention.

Referring back to FIG. 6, in at least one embodiment of integrated circuit 102, node 607 is coupled to the oscillator input terminal (e.g., XTAL_IN) rather than the oscillator output terminal (e.g., XTAL_OUT). Referring to FIG. 7, in at least one embodiment, integrated circuit 102 configures itself for operation with an oscillator of one of a plurality of frequencies by coupling the oscillator output terminal (e.g., XTAL_OUT) to an internal ground node after a power-on sequence and during a first mode of operation, e.g., an initialization (i.e., setup or configuration) mode. The load impedance of the remaining circuit has an equivalent value of $C_1 \| C_O \| Z_m$. Switch 702 is included to decouple device 206, which is coupled to ground and effectively turned off and current source 602 is independent of current source 304. When the XTAL_OUT node is coupled to ground, capacitor $C_1$ is effectively removed from the circuit. Since $Z_m \ll C_1, C_O$, in that configuration, for a constant charging current, the load on XTAL_OUT then looks like a capacitance of value $C=C_1+C_O$, where $C_1$ is the external capacitor on the oscillator input terminal and $C_O$ is the shunt capacitance of the crystal. Thus, oscillator 110, which is coupled to integrated circuit 102, is configured as a substantially capacitive external load coupled to the oscillator output terminal when sufficiently far away from the resonant frequency. The charge time of the load capacitance external to integrated circuit 102 is then determined and used to configure integrated circuit 102 according to techniques described above with respect to the configuration of FIG. 4.

Figure 8:
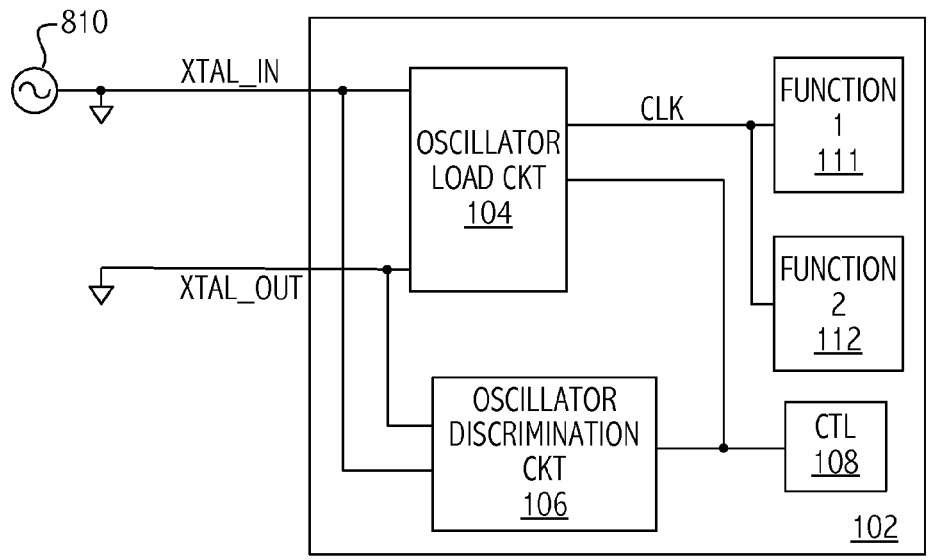
FIG. 8 illustrates a functional block diagram of an integrated circuit configured to generate a clock signal using an external CMOS clock consistent with at least one embodiment of the invention.
Figure 9:
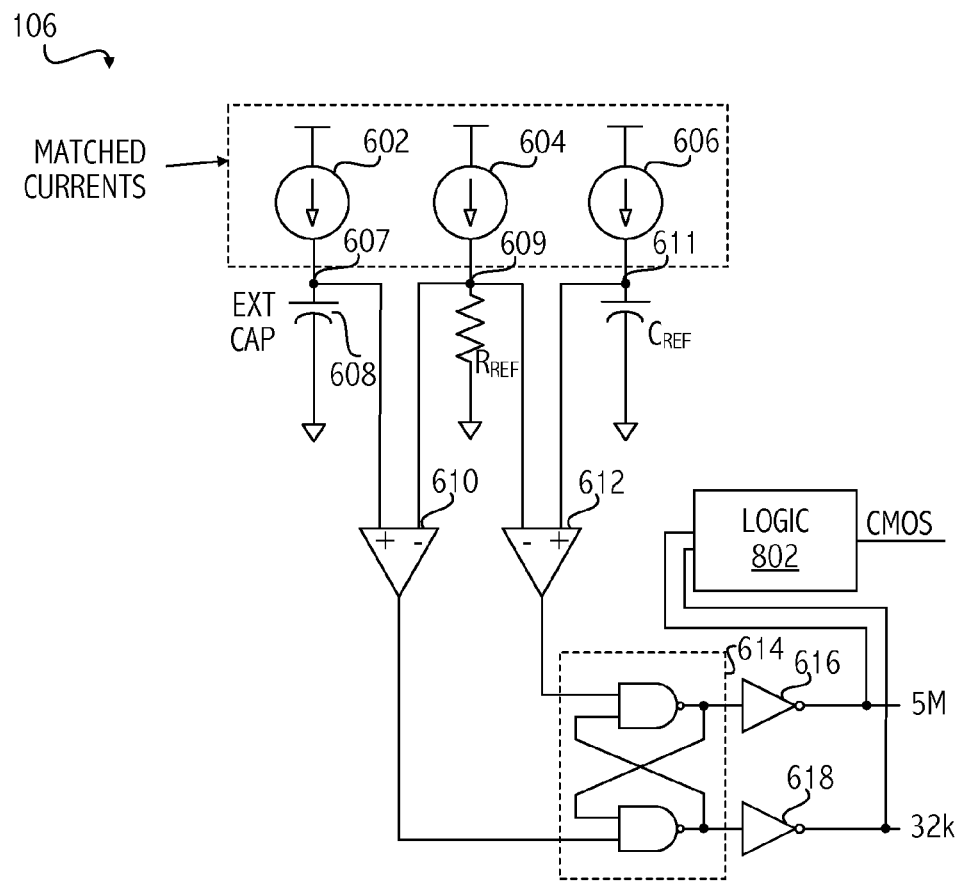
FIG. 9 illustrates a circuit diagram of an oscillator discrimination circuit consistent with at least one embodiment of the invention.

Referring to FIG. 8, in at least one embodiment, integrated circuit 102 supports a CMOS clock mode. For example, a CMOS clock (e.g., CMOS clock 810) is coupled to XTAL_IN of integrated circuit 102. Referring to FIG. 9, in at least one embodiment, oscillator discrimination circuit 106 includes circuitry (e.g., logic 802) to detect the CMOS clock and the absence of a crystal on the input terminals of integrated circuit 102. After the power-on sequence and during the first mode of integrated circuit 102 (e.g., an initialization, setup, or configuration mode), a user indicates that a CMOS clock is coupled to integrated circuit 102 by coupling both XTAL_IN and XTAL_OUT to a ground node. A CMOS clock configured for operation with integrated circuit 102 exhibits different behavior than a crystal oscillator, e.g., load capacitors $C_1$ and $C_2$ are absent and the CMOS clock does not behave like a capacitor when driven with a DC current. Instead, current is sunk by a corresponding driver (not shown), which may provide an insubstantial capacitance on the terminal of the integrated circuit. The load capacitance external to the integrated circuit when coupled to a CMOS clock is substantially less than the load capacitance when the integrated circuit is coupled to a crystal oscillator. If at least one of the outputs of inverters 616 and 618 does not transition within a reasonable amount of time (e.g., three times a maximum charging time), then logic circuit 802 generates an indicator that a CMOS clock is coupled to the input. In other embodiments, logic circuit 802 monitors the output of comparator 610 or the outputs of circuit 614 to determine the indicator.

Referring back to FIG. 8, in at least one embodiment of integrated circuit 102, when the output of oscillator discrimination circuit 106 indicates that a CMOS clock is coupled to the integrated circuit, integrated circuit 102 (e.g., directly or via control circuit 108) disables oscillator load circuit 104 and handles the signal received from CMOS clock 810 as a digital signal. In this bypass mode, integrated circuit 102 disables current source 304 of oscillator load circuit 104 of FIG. 3 and the CMOS clock signal is routed through another path (e.g., a path including a Schmitt trigger). In at least one embodiment of integrated circuit 102, rather than bypass oscillator load circuit 104 when the output of oscillator discrimination circuit 106 indicates that a CMOS clock is coupled to the integrated circuit, CMOS clock 810 overdrives oscillator load circuit 104.

While circuits and physical structures are generally presumed, it is well recognized that in modern semiconductor design and fabrication, physical structures and circuits may be embodied in computer-readable descriptive form suitable for use in subsequent design, test, or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic storage medium.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. An apparatus comprising:
 an integrated circuit comprising:
  a first oscillator terminal; and
  an oscillator discrimination circuit operative to generate an indicator of a capacitance value of a load capacitance associated with an external oscillator coupled to the first oscillator terminal, the indicator being generated according to a charge time of a reference node coupled to a reference capacitor and a charge time of a node coupled to the first oscillator terminal, the node and the reference node being charged using substantially matched currents.

2. The apparatus, as recited in claim 1, wherein the integrated circuit further comprises:
 a second oscillator terminal; and
 an oscillator load circuit coupled to the first and second oscillator terminals,
 wherein the integrated circuit is responsive to configure the oscillator load circuit based on the indicator.

3. The apparatus, as recited in claim 1, wherein the oscillator discrimination circuit comprises:
 a circuit responsive to generate a first indicator indicating which of a first node and a second node first transitions from a reset voltage level to a reference voltage level.

4. The apparatus, as recited in claim 3, wherein the oscillator discrimination circuit further comprises:
 a first comparator responsive to generate a first signal indicating a difference between a voltage on the first node and a reference voltage;
 a second comparator responsive to generate a second signal indicating a difference between a voltage on the second node and the reference voltage,
 wherein the first indicator is based on the first and second signals.

5. The apparatus, as recited in claim 4, wherein the oscillator discrimination circuit further comprises:
 a first current source coupled to the first node;
 a second current source coupled to the second node; and
 a third current source coupled to a reference resistance and responsive to generate the reference voltage.

6. The apparatus, as recited in claim 5, wherein the first, second, and third current sources provide substantially matched currents, the first node is the node coupled to the first oscillator terminal, and the second node is the reference node.

7. The apparatus, as recited in claim 3, wherein the circuit comprises a latch circuit.

8. The apparatus, as recited in claim 3, further comprising:
 at least one load capacitor external to the integrated circuit and coupled to the first oscillator terminal; and
 the external oscillator, wherein the external oscillator includes a crystal oscillator external to the integrated circuit and coupled to the first oscillator terminal,
 wherein the load capacitance includes capacitance associated with the at least one load capacitor and the crystal oscillator.

9. The apparatus, as recited in claim 1, wherein the integrated circuit further comprises:
 a second oscillator terminal,
 wherein the first oscillator terminal is an oscillator output terminal and the second oscillator terminal is an oscillator input terminal coupled to a ground power supply voltage.

10. The apparatus, as recited in claim 1, wherein the integrated circuit further comprises:
 a second oscillator terminal,
 wherein the first oscillator terminal is an oscillator input terminal and the second oscillator terminal is an oscillator output terminal coupled to a ground power supply voltage.

11. The apparatus, as recited in claim 1, wherein the integrated circuit further comprises:
 a second oscillator terminal;
 wherein the external oscillator includes a complementary metal-oxide-semiconductor (CMOS) clock; and
 wherein the first and second oscillator terminals are coupled to ground and the second oscillator terminal is coupled to the CMOS clock.

12. The apparatus, as recited in claim 1, wherein the indicator is further generated according to a comparison of the charge time of the reference node coupled to the reference capacitor and the charge time of the node coupled to the first oscillator terminal.

13. A method comprising:
 in a first mode of operating an integrated circuit,
  charging an external capacitive load associated with an external oscillator using a first current and charging a reference capacitor using a second current, the first and second currents being substantially matched currents; and
  comparing a first charge time of the external capacitive load to a second charge time of the reference capacitor and supplying an indicator based thereon.

14. The method, as recited in claim 13, further comprising:
 in a second mode of operating the integrated circuit, providing a clock signal to circuits on the integrated circuit based on an oscillating signal received on an oscillator input terminal and an oscillator output terminal and an oscillator load circuit configured according to the indicator.

15. The method, as recited in claim 13, further comprising:
in the first mode of operating the integrated circuit, configuring an oscillator load circuit according to the indicator.

16. The method, as recited in claim 15, wherein configuring the oscillator load circuit comprises selectively enabling a current source circuit from a plurality of current source circuits according to the indicator.

17. The method, as recited in claim 13, further comprising:
in the first mode of operating the integrated circuit, detecting a first node of a plurality of nodes to charge to a reference voltage level,
wherein the plurality of nodes includes a reference node and a node coupled to the external capacitive load and one of an oscillator input terminal and an oscillator output terminal, and the other of the oscillator input and output terminals is coupled to a ground voltage.

18. The method, as recited in claim 17, further comprising:
in the first mode of operating the integrated circuit, resetting an oscillator discrimination circuit prior to the detecting.

19. The method, as recited in claim 17, wherein the discriminating comprises:
comparing a first voltage on the node coupled to the oscillator output terminal to the reference voltage level; and
comparing a second voltage on the reference node to the reference voltage level.

20. An apparatus comprising:
an integrated circuit comprising:
an oscillator input terminal; and
an oscillator output terminal,
wherein the integrated circuit is responsive in a first mode to self-select a mode of operating the integrated circuit in response to a charge time of a capacitive load external to the integrated circuit and coupled to one of the oscillator input and output terminals, and
wherein in a second mode of operation, the integrated circuit is responsive to generate a system clock signal according to the charge time.

21. The apparatus, as recited in claim 20, further comprising an oscillator external to the integrated circuit and coupled to the oscillator output terminal, wherein the capacitive load includes the oscillator.

22. The apparatus, as recited in claim 21, wherein the oscillator is a crystal oscillator.

23. The apparatus, as recited in claim 21, wherein the integrated circuit comprises:
an oscillator load circuit coupled to the oscillator input terminal and the oscillator output terminal,
an oscillator discrimination circuit operative to generate an indicator of a capacitance value of a load capacitance external to the integrated circuit and coupled to one of the oscillator input terminal and oscillator output terminal, the indicator being generated according to a charge time of a reference node coupled to a reference capacitor and a charge time of a node coupled to the one of the oscillator input and output terminals, the node and the reference node being charged using substantially matched currents.

24. The apparatus, as recited in claim 23, wherein the oscillator discrimination circuit comprises:
a circuit responsive to generate a first indicator indicating a first one of a first node and a second node to transition from a reset voltage level to a reference voltage level.

* * * * *